United States Patent
Yoshikawa et al.

(10) Patent No.: US 6,875,478 B2
(45) Date of Patent: Apr. 5, 2005

(54) APPARATUS AND PROCESS FOR FILM DEPOSITION

(75) Inventors: Masato Yoshikawa, Kodaira (JP); Yoshinori Iwabuchi, Kodaira (JP); Shingo Ohno, Kodaira (JP); Yukihiro Kusano, Kodaira (JP)

(73) Assignee: Bridgestone Corporation, Tokyo (JP)

( * ) Notice: Subject to any disclaimer, the term of this patent is extended or adjusted under 35 U.S.C. 154(b) by 0 days.

(21) Appl. No.: 10/066,380

(22) Filed: Feb. 5, 2002

(65) Prior Publication Data

US 2002/0144656 A1 Oct. 10, 2002

(30) Foreign Application Priority Data

Feb. 6, 2001 (JP) ........................................ 2001-030061

(51) Int. Cl.[7] .............................. B05D 1/04; C23C 16/00; C23C 14/00
(52) U.S. Cl. ...................... 427/471; 427/209; 118/718; 204/298.24
(58) Field of Search ................................ 427/209, 471; 204/298.24, 298.1, 12; 118/718

(56) References Cited

U.S. PATENT DOCUMENTS

| | | | | |
|---|---|---|---|---|
| 2,996,412 A | * | 8/1961 | Alexander | 427/248.1 |
| 3,959,104 A | * | 5/1976 | Fales | 204/164 |
| 4,419,381 A | * | 12/1983 | Yamazaki | 427/39 |
| 4,437,324 A | * | 3/1984 | Sando et al. | 68/5 E |
| 4,635,586 A | * | 1/1987 | Diener et al. | 118/718 |
| 4,826,707 A | * | 5/1989 | Schwarz et al. | 427/177 |
| 4,872,932 A | * | 10/1989 | Yoshikawa et al. | 156/151 |
| 5,196,100 A | | 3/1993 | Goffetre et al. | |
| 5,198,033 A | * | 3/1993 | Kelley et al. | 118/718 |
| 5,595,792 A | * | 1/1997 | Kashiwaya et al. | 427/570 |
| 5,711,994 A | * | 1/1998 | Powers | 427/255.6 |
| 6,028,016 A | * | 2/2000 | Yahiaoui et al. | 442/118 |

FOREIGN PATENT DOCUMENTS

| | | | |
|---|---|---|---|
| DE | 43 33 825 C1 | 2/1995 | |
| WO | WO 9843469 A1 | * 10/1998 | ............ H05K/9/00 |

OTHER PUBLICATIONS

*Patent Abstracts of Japan*, vol. 011, No. 112 (P–565) (Apr. 9, 1987) re JP 61 260425 (Nov. 18, 1986), ABS only.
*Patent Abstracts of Japan*, vol. 011, No. 040 (P–544) (Feb. 25, 1987) re JP 61 208624 (Sep. 17, 1986), ABS only.
*Patent Abstracts of Japan*, vol. 016, No. 411 (C–0979) (Aug. 31, 1992) re JP 04 136167 (May 11, 1992), ABS only.

* cited by examiner

*Primary Examiner*—Parviz Hassanzadeh
*Assistant Examiner*—Karla Moore
(74) *Attorney, Agent, or Firm*—Sughrue Mion, PLLC

(57) ABSTRACT

A film deposition apparatus equipped with a vacuum chamber, comprising a pair of rollers for vertically traveling a continuous sheet as a substrate, and a pair of sputtering cathodes for continuously depositing the film on the surfaces of the sheet in the vacuum chamber. The cathodes are vertically arranged and horizontally faced each other. The sheet is traveled between a pair of the cathodes. The apparatus and the film deposition process using it make it possible to deposit a film even on surfaces of a flexible sheet without causing problems such as defective film deposition or abnormal discharge, while ensuring stable, continuous, long-term operation.

6 Claims, 3 Drawing Sheets

APPARATUS AND PROCESS FOR FILM DEPOSITION

BACKGROUND OF THE INVENTION

1. Field of the Invention

The present invention relates to an apparatus and a process for film deposition, and more particularly, to an apparatus and a process for depositing a film on surfaces of a flexible sheet, in particular, a lightweight rubber reinforcement sheet in a continuous and stable manner.

2. Description of the Related Art

An apparatus for depositing a film on a substrate with the use of sputtering techniques are generally divided into two groups: the "deposition-up" type and the "deposition-down" type. The substrate is positioned above a cathode in the deposition-up type, while the substrate is positioned below the cathode in the deposition-down type. In a film deposition process using sputtering, sputtered metal is re-deposited on the surface of the cathode, so that a powdered substance is peeled from the cathode when the process is continued for a prolonged time. Therefore, in the deposition-down type apparatus, the powder substance falls on the substrate to thereby cause imperfections in the deposited film, which often results in defective film deposition.

On the other hand, when the substrate is, for example, a non-woven fabric sheet, which is generally used for producing lightweight rubber reinforcements, and if the substrate is not properly treated to fix short fibers in the non-woven fabric, small fiber dust is produced during the traveling of the substrate in the apparatus. Therefore, this dust material is deposited on the surface of the target in the deposition-up type apparatus and prevents the target from performing discharge operation for a long time in a stable manner. Though such an unstable discharge can be avoided by laterally moving the traveling substrate, the use of the non-woven fabric sheet makes it difficult to horizontally travel the sheet between a pair of supporting rollers under such a condition that it remains strained, because the sheet itself lacks rigidity and thus easily slacks against the gravity In view of the above-described problems, it is an objective of the present invention to provide an apparatus and a process for film deposition which can continuously conduct a stable film deposition for a long time without causing problems such as defective film deposition, faulty discharge and the like, even if the film is deposited to the surface of a flexible sheet such as a non-woven fabric sheet used in a lightweight rubber reinforcement.

SUMMARY OF THE INVENTION

The present invention provides an apparatus for film deposition equipped with a vacuum chamber capable of maintaining vacuum therein, in which a film is deposited on surfaces of a substrate, which comprises traveling means for vertically traveling a continuous sheet as the substrate; and a pair of film deposition means for continuously depositing the film on the surfaces of the continuous sheet; the film deposition means being vertically arranged and horizontally faced each other, and the continuous sheet is traveled between a pair of the film deposition means.

Furthermore, the present invention provides a process for film deposition in which a film is deposited on surfaces of a substrate in a vacuum chamber capable of maintaining vacuum therein, which comprises the steps of vertically traveling a continuous sheet as the substrate; and continuously conducting a film deposition on the surface of the continuous sheet; the film deposition being conducted horizontally on the surfaces of the vertically traveling continuous sheet.

BRIEF DESCRIPTION OF THE DRAWINGS

These and other objectives and advantages of the present invention will become apparent from the following description with reference to the accompanying drawings, wherein.

DESCRIPTION OF THE PREFERRED EMBODIMENTS

The present invention will now be described with reference to the accompanying drawings.

Figure 1:
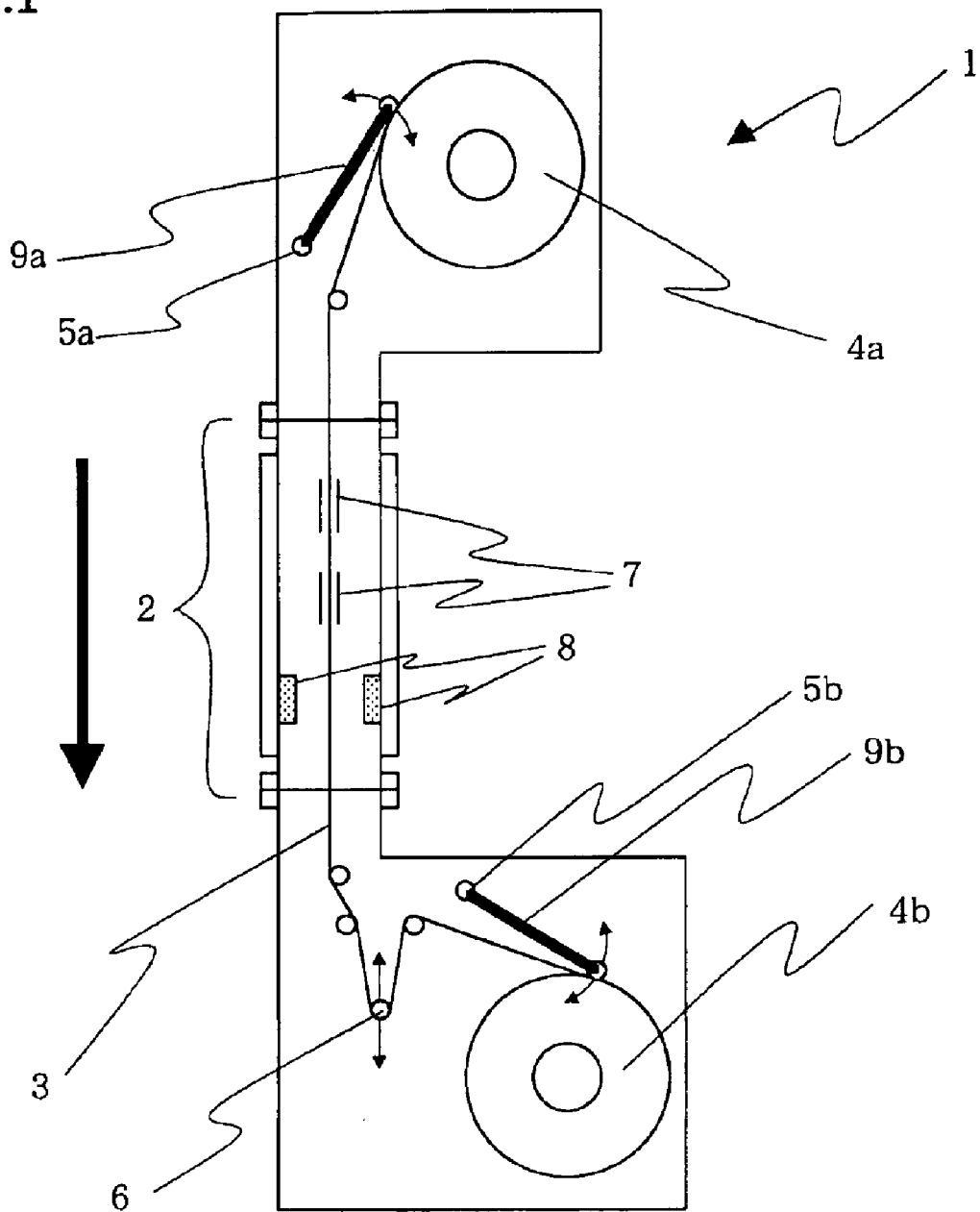
FIG. 1 is a vertical cross sectional view of one example of a film deposition apparatus in accordance with the present invention.
Figure 2:
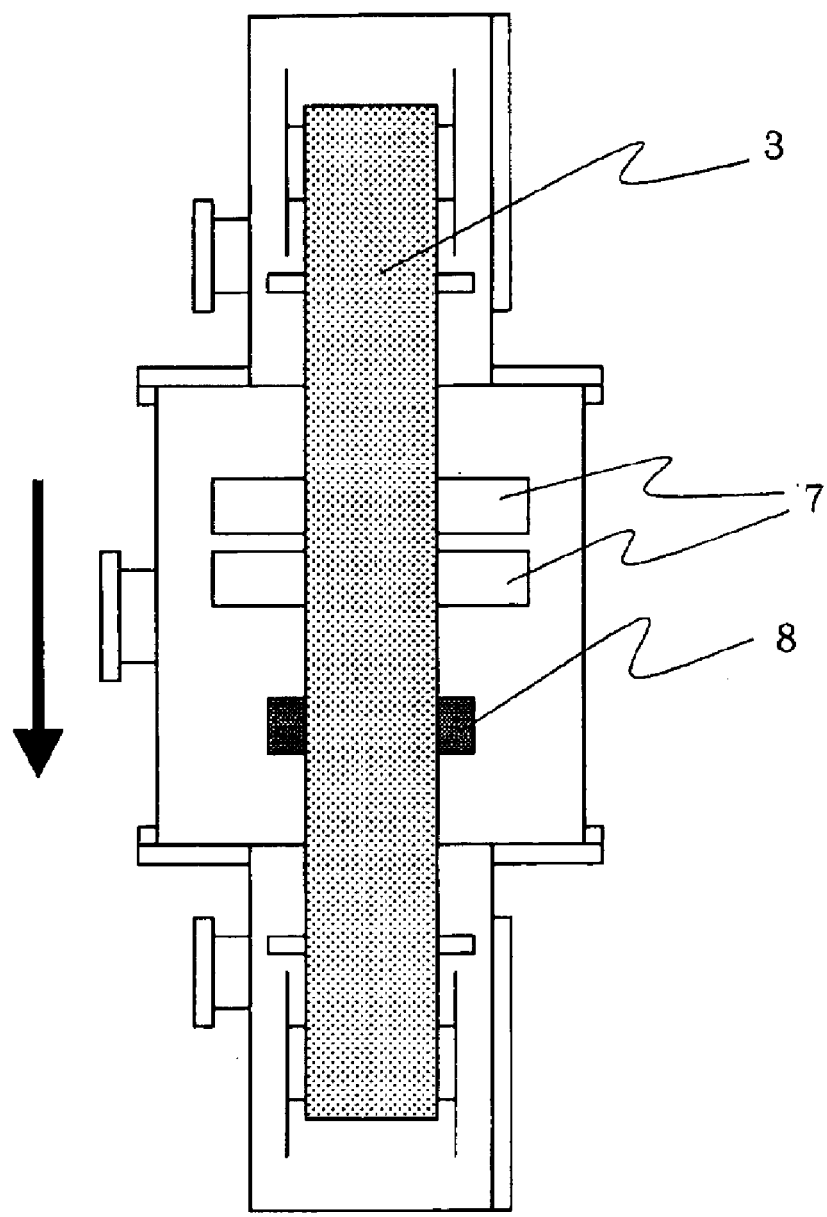
FIG. 2 is a horizontal cross sectional view of the film deposition apparatus shown in FIG. 1.

Referring to FIGS. 1 and 2, a film deposition apparatus 1 of the present invention is equipped with a vacuum chamber 2 which can maintain vacuum therein. The film deposition is conducted on surfaces of a continuous sheet 3 as a substrate traveling through the vacuum chamber 2.

The film deposition apparatus 1 of the present invention has a pair of rollers, a supply roller 4a and a take-up roller 4b as traveling means for traveling the continuous sheet 3. The two rollers 4a and 4b are vertically spaced apart from one another. Accordingly, this arrangement makes it possible to roll up the continuous sheet 3 under such a condition that the continuous sheet 3 dose not slack and remains strained during the traveling, as compared to that using conventional sheet-traveling means which travel the continuous film sheet in a horizontal direction. In particular, the arrangement according to the present invention is advantageous when the substrate is made of a flexible material that lacks rigidity and thus can easily undergo deformation even when a relatively small tensile force is applied, that is, a material that tends to slack and is incapable of withstanding a high tension. Accordingly, the uniformly deposited film that is free of any defects or unevenness can be obtained even on the surfaces of such a material.

As shown in FIGS. 1 and 2, the supply roller 4a and the take-up roller 4b in the film deposition apparatus 1 according to the present invention are driven by drive motors 5a and 5b, respectively, to travel the continuous sheet 3 from up to down. In that event, two touch rolls 9a and 9b are arranged in order to control the traveling speed. Further, a dancing roller 6 is arranged to properly adjust the tension of the traveling continuous sheet 3 in order to ensure a continuous and stable film deposition. When a non-woven fabric having a mass of 40 g/m$^2$ is used as the continuous sheet 3 in the present invention, preferred tension of the sheet 3 is in the range of 1 N/m to 15 N/m. When the tension is less than 1 N/m, it is not favorable because the non-woven fabric can not be smoothly traveled. On the other hand, the tension exceeds 15 N/m, the non-woven fabric is undesirably stretched evenly to cause a deformation.

Furthermore, as shown in FIG. 1, according to the present invention, a pair of sputtering cathodes 8 as film deposition means are vertically arranged and horizontally faced each other, and the continuous sheet 3 is traveled between a pair of the sputtering cathodes 8. That is, in the film deposition apparatus 1 of the present invention, the film deposition direction by sputtering is changed from the vertical direction which is employed in a conventional film deposition apparatus, to the horizontal direction. This change enables the dust originating from the substrate and the powdered substance originating from the cathodes to fall to the lower part, respectively, without falling on or sticking to the substrate or the cathodes, and thus eliminates the problems associated with the conventional apparatus such as defective film formation, unevenness of the film and abnormal discharge. Accordingly, the vertical arrangement according to the present invention, together with the above-described traveling means, makes it possible to deposit a film on a flexible, dust-generating substrate in a continuous and stable manner, without causing any film defects or abnormal discharge.

Examples of materials that can be used as the continuous sheet 3 in the present invention include, but are not limited to, a non-woven fabric, a web and a knit that are formed of organic fibers. Among then, the non-woven fabric is particularly suitable. In particular, a lightweight, flexible rubber reinforcement can be obtained by depositing a film of a metal such as cobalt or a metallic compound reactable with sulfur on the surface of the organic fiber material such as non-woven fabric and the like. That is, deposition of such a metal film on the surface of the organic fiber material can facilitate an adhesion between the organic fiber material and a rubber, which are otherwise difficult to adhere to one another, and thus the resulting composite can be suitably used as a rubber reinforcement by combining to rubber articles such as a tire and the like upon vulcanization. Accordingly, a high durability can be achieved in rubber articles with the use of the rubber reinforcement in accordance with the present invention.

Though a non-woven fabric of any material and fiber structure may preferably be used in the present invention, it is particularly preferred to have a structure in which a rubber can penetrate between fiber filaments and in which a rubber mutually form a continuous layer over a relatively long distance and a relatively wide range. The mass per area of the non-woven fabric is preferably in the range of 5 to 300 $g/m^2$, more preferably in the range of 10 to 100 $g/m^2$. When the mass per area is less than 5 $g/m^2$, uneven non-woven fabric may be obtained because maintaining uniformity of the non-woven fabric itself becomes difficult and a composite prepared from the non-woven fabric and a rubber may show great random variations in strength, rigidity, and elongation at break after the composite is vulcanized. On the other hand, when the mass per area exceeds 300 $g/m^2$, a rubber tends not to penetrate the space in the non-woven fabric though it depends on the fluidity of the rubber. Such a mass per area is not preferable in view of the peeling resistance of the rubber-non-woven fabric composite when the composite is used as a tire component.

As the sputtering cathodes 8 in the film deposition means, magnetron sputtering cathodes are preferably used. This reason is because magnetron sputtering has such advantages that it can deposit a film on a complex shape; it inflicts no damage on the non-woven fabric; the resulting film has a good adhesion; and the like.

The sputtering conditions, particularly the magnetron sputtering conditions are, for example, as follows. The atmospheric gas is an inert gas such as Ar, He, Ne and Kr, particularly Ar, alone or in the combination thereof. As needed, a reactive gas, for example, oxygen-containing gas such as $O_2$, $H_2O$ and the like, nitrogen-containing gas such as $N_2$, $NH_3$ and the like, or carbon-containing gas such as $CH_4$ and the like may be mixed to the inert gas. The mixing ratio by volume of an inert gas to a reactive gas is 100/0 to 0/100 (inert gas/reactive gas), preferably 100/0 to 20/80, and more preferably 100/0 to 70/30.

The gas pressure may have any value at which the sputtering can be performed, but is preferably from $1\times10^{-2}$ Pa to $5\times10^2$ Pa, more preferably from $5\times10^{-2}$ Pa to $1\times10^1$ Pa. A power supply (supplied to a target) may be either known DC or AC. Generally, a DC power supply, radio frequency (RF) power supply and the like can be employed. A pulsed power supply may also be used.

The so-called "ionized magnetron sputtering" in which the particles under sputtering are activated by inductive plasma generated between a target and a substrate may also be applied.

The average thickness of a film deposited by such a sputtering process is, preferably from $5\times10^{-10}$ m to $1\times10^{-5}$ m, more preferably from $1\times10^{-9}$ m to $5\times10^{-7}$ m. If the film is too thin, the adhesion will be insufficient. On the other hand, if too thick, the film tends to separate from the substrate due to an internal stress of the film. Such a film is only required to be deposited on the surface of the filaments of the non-woven fabric in at least an amount enough to cause a sulfuration reaction. There is no need for a film to be deposited uniformly. When the film is exposed to the atmosphere during or after its deposition, it sometimes reacts with oxygen or water vapor in the air, resulting in the contamination of impurities such as oxygen and hydrogen into the film. If necessary, treatment such as plasma treatment, ion implantation, ion irradiation and heat treatment may be conducted after the film deposition to improve surface conditions, reactivity, internal stress and the like of the film.

Furthermore, it is desirable to fully clean the surface of the non-woven fabric as a pre-treatment, if necessary, before the film deposition. Preferred cleaning methods include washing with a solvent, discharge, and a combination of the washing with a solvent and the discharge. As shown in FIG. 1, for example, the discharge process involves the use of RF electrodes 7 (connected to a RF power supply) that serve as pretreatment electrodes. The surfaces of the continuous sheet 3 are cleaned by discharge between the pretreatment electrodes 7 prior to the film deposition through the sputtering cathodes 8. In that event, a power supply for the sputtering cathodes 8 and a power supply for the pretreatment electrodes 7 are preferably provided individually to conduct power supplies separately. Two or more cleaning techniques may be combined to enhance the cleaning effects.

Preferred examples of target materials for the sputtering cathodes 8 as a source of the film deposition include, but are not limited to, cobalt (Co), copper (Cu), zinc (Zn), titanium (Ti), silver (Ag), tin (Sn) or alloys thereof. In particular, when it is desired to obtain the above-described rubber reinforcement, a metal or a metallic compound reactive with sulfur, as well as its alloys, oxides and nitrides can be employed. For example, in addition to the above, Chromium (Cr), Aluminium (Al), Nickel (Ni), Lead (Pb), Tungusten (W), alloys comprising two or more of these metals and their compounds such as oxides, nitrides, carbides, sulfides and sulfates can also be employed. Particularly, metals and alloys such as Co, Co/Cr alloy, Cu/Zn alloy and Cu/Al alloy, and their oxides can be preferably used. More preferably, Co and its oxides are used (see, Japanese Patent Laid-Open Publication Nos. Sho. 62-87311, Sho. 62-246287 and Hei. 1-290342). The compounds such as oxides, nitrides and carbides may be both those with a stoichiometric composition and those with a non-stoichiometric composition. Preferred are those having ratios of metal elements greater than stoichiometric values.

In one embodiment of the rubber reinforcement obtained by depositing a film on the continuous sheet 3 according to the present invention, it seems that when an uncured rubber is laminated to the rubber reinforcement to fabricate the laminate into a desired shape and then to subject it to a heat press treatment, an adhesion occurs during the cure of the rubber through the sulfuration of the film and the rubber, so that the rubber composite material reinforced with the rubber reinforcement can be obtained. Such a composite formation can be effected by pressing both or either surface of the uncured rubber composite sheet through a press or a roller to replace air in the non-woven fabric with the rubber. The cure and the sulfuration conflict with each other. In order for both reactions to be appropriately conducted, the both reactivities must be matched. In the film deposition by sputtering, a thin film of a compound with a moderate sulfuration reactivity can be easily deposited by the addition of an appropriate amount of a reactive gas such as oxygen and nitrogen to an inert gas such as Ar during the film deposition.

As described above, according to the present invention, it possible to deposit a film even on the surfaces of a flexible sheet without causing problems such as defective film deposition or abnormal discharge, while ensuring stable, continuous and long-term operation. Therefore, the material having the film deposited thereon in accordance with the present invention can be used as, for example, a rubber reinforcement to reinforce the side portions of a radial tire and significantly improve the running durability as well as the driving stability.

EXAMPLES

The following examples are given for the purpose of illustration of the present invention and are not intended as limitation thereof.

Traveling Conditions

A roll of polyester non-woven fabric having 100 m in length, 300 mm in width, 0.7 mm in thickness and 40 g/m$^2$ in mass was placed in a film deposition apparatus 1 as shown in FIGS. 1 and 2 to serve as the continuous sheet 3. The chamber 2 was evacuated using a vacuum pump. To avoid deformation of the non-woven fabric due to excessive tension, the sheet 3 was traveled under a tension of about 6.5 N/m at a traveling speed of 0.2 m/min during the pretreatment and at 0.6 m/min during the film deposition.

Pretreatment Conditions

A RF power supply was used to generate a plasma discharge between a pair of parallel planar electrodes (gap: 20 mm), each of which is 200 mm in length and 400 mm in width and serves as the pretreatment electrodes 7. Under the above-described conditions, the non-woven fabric was passed between the electrodes 7 to subject both surfaces of the non-woven fabric to a pretreatment.

Film Deposition Conditions

Two cathodes (magnetron sputtering guns) equipped with cobalt targets (purity 3N), respectively, each of which has the size of 400 mm(width)×100 mm, were arranged as the sputtering cathodes 8 to deposit a film on the both surfaces of the non-woven fabric by applying a power of 2000 W from a high voltage DC power supply to each cathode. Since the used gas was composed solely of argon, a cobalt film with a thickness of about 20 nm was deposited.

Results of Film Deposition

There was little change in the size of the non-woven fabric on which the cobalt film was deposited as aforementioned, as compared to one prior to the film deposition. The resulting film was uniformly coated with cobalt on both surfaces thereof. When the non-woven fabric was traveled under a tension of 35.0 N/m for comparison, it was stretched in several places and was even torn to cause large holes in some part.

Amount of Arc Discharge During the Film Deposition

As Example 1, when the continuous film deposition (1 hour) was conducted based on the above-described conditions and procedures (tension: about 6.5 N/m), the number of arc discharges that took place in the cathodes was measured. The results are shown in Table 1 below along with the results obtained by using a film deposition apparatus of the deposition-up type as Comparative Example 1.

TABLE 1

|  | Example 1 (Apparatus shown in FIG. 1) | Comparative Example 1 (deposition-up type) |
| --- | --- | --- |
| Number of arc discharges | 5 | 64 |

As shown in the above Table 1, the number of arc discharges that took place during the one-hour film deposition process was significantly decreased in Example 1 as compared to Comparative Example 1.

Next, different rubber reinforcements were manufactured by using the same traveling conditions and the same pretreatment conditions as those for Example 1 and then using the film deposition conditions shown in Table 2 below. The resulting rubber reinforcements composed of the film deposited non-woven fabric were used to prepare radial tires. As for these tires, the driving test was carried out.

The film deposition conditions are as follows.

Two cathodes (magnetron sputtering guns) equipped with cobalt targets (purity 3N), respectively, each of which has the size of 400 mm(width)×100 mm, were arranged as the sputtering cathodes 8 to deposit a film on the both surfaces of the non-woven fabric by applying a given power from a high voltage DC power supply to each cathode. Using mixtures of cobalt and oxygen gas, cobalt oxide films were deposited. As a Comparative Example, a non-woven fabric that had not been subjected to the pretreatment and the Co film deposition was also used.

TABLE 2

|  | Cleaning | | | | Film deposition | | | |
| --- | --- | --- | --- | --- | --- | --- | --- | --- |
|  | Gas | Pressure (Pa) | Power density (W) | Time (sec) | Ar/O$_2$ flow ratio | Supply power (W) | Pressure (Pa) | Average film thickness (nm) |
| Ex. 2 | Ar | 100 | 500 | 60 | 50/0 | 2000 | 0.7 | 2 × 10$^1$ |
| Ex. 3 | Ar | 100 | 500 | 60 | 50/4 | 2000 | 0.7 | 2 × 10$^1$ |
| Ex. 4 | Ar | 100 | 500 | 60 | 50/13 | 2000 | 0.7 | 2 × 10$^1$ |
| Comp. Ex. 2 | — | — | — | — | — | — | — | — |

Figure 3:
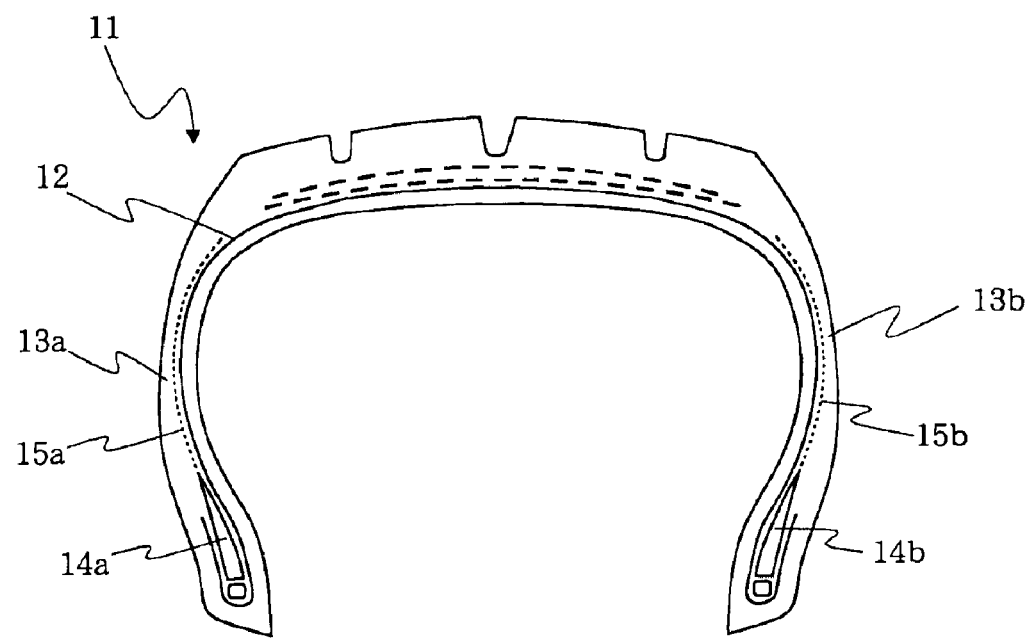
FIG. 3 is a cross sectional view of one exemplary radial tire of Examples.

As reinforcing layers 15a, 15b, rubber-based composite materials obtained by integrally covering the non-woven fabric with an uncured rubber from both sides of the fabric, were stuck over a length of 50 mm from the top ends of bead fillers 14a, 14b between a carcass layer 12 and sidewalls 13a, 13b as shown in FIG. 3. The thus obtained raw tire in which an uncured rubber composite material was applied as a fibrous reinforcing layer was shaped and then cured, resulting in a radial tire with a size of 195/60R15 containing a carcass ply of PET 1670 dtex/2. On the other hand, as a conventional example, a radial tire was prepared in the same manner except applying no reinforcing material layer.

As for these tires, the driving stability test and the drum durability test under a high load were conducted.

<Driving Stability>

A car (a domestically produced FF car with a 2000-cc engine) equipped with experimental tires was practically driven under the straight running and lane-changing conditions. The driving stability was evaluated from the driver's feeling. The evaluation was classified in comparison to the control (conventional tire) as follows:

-8: It is worse than the control.
-4: It is slightly worse than the control.
-2: It possibly is slightly worse than the control.
0: It is equivalent to the control.
+2: It possibly is slightly better than the control.
+4: It is slightly better than the control.
+8: It is better than the control.

The total points are expressed in indexes based on the control of 100.

<Drum Durability Under a High Load>

An experimental tire whose internal pressure had been adjusted to the maximum air pressure provided in the JATMA standard was left in a room at 25° C.±2° C. for 24 hours. Then, its internal pressure was readjusted to the maximum air pressure. The tire was rotated on a drum 1.7 m in diameter at a rate of 60 km/h under the application of a load twice the maximum load provided in the JATMA standard. The distance traveled before the occurrence of a failure was measured and indicated as an index based on that of the conventional tire equal to 100. The greater the index, the better the result. The results are given in Table 3.

TABLE 3

|  |  | Conventional tire | Comp. Ex. 2 | Ex. 2 | Ex. 3 | Ex. 4 |
|---|---|---|---|---|---|---|
| Test Results | Driving Stability | 100 | 94 | 120 | 116 | 111 |
|  | Drum Durability | 100 | 88 | 192 | 190 | 181 |

What is claimed is:

1. A process for film deposition in which a film is deposited on surfaces of a substrate in a vacuum chamber capable of maintaining a vacuum therein, which comprises substantially vertically traveling a continuous sheet as a substrate; and continuously conducting a film deposition on the surfaces of the continuous sheet; the film deposition being conducted substantially horizontally on the surfaces of the substantially vertically traveling continuous sheet by film depositors provided directly across from and facing each other on opposite sides of the continuous sheet, and the continuous sheet being a non-woven fabric having a mass of about 5 to 300 g/m$^2$.

2. A process for film deposition in which a film is deposited on surfaces of a substrate in a vacuum chamber capable of maintaining a vacuum therein, which comprises substantially vertically traveling a continuous sheet as a substrate; and continuously conducting a film deposition on the surfaces of the continuous sheet; the film deposition being conducted substantially horizontally on the surfaces of the substantially vertically traveling continuous sheet by film depositors facing each other across the continuous sheet, and the continuous sheet being a non-woven fabric having a mass of about 5 to 300 g/m$^2$, wherein the film depositors comprise cathodes, and the film deposition is carried out using a target material for the cathodes, wherein the target material is cobalt, copper, zinc, titanium, silver, tin, or an alloy thereof.

3. A process for film deposition in which a film is deposited on surfaces of a substrate in a vacuum chamber capable of maintaining a vacuum therein, which comprises substantially vertically traveling a continuous sheet as a substrate; and continuously conducting a film deposition on the surfaces of the continuous sheet; the film deposition being conducted substantially horizontally on the surfaces of the substantially vertically traveling continuous sheet by film depositors facing each other across the continuous sheet, and the continuous sheet being a non-woven fabric having a mass of about 5 to 300 g/m$^2$, wherein a gas is utilized for the film deposition, and the gas is an inert gas, or a gas mixture of the inert gas and one or more kinds selected from the group consisting of oxygen-containing gas, nitrogen-containing gas and carbon-containing gas.

4. A process for film deposition in which a film is deposited on surfaces of a substrate in a vacuum chamber capable of maintaining a vacuum therein, which comprises substantially vertically traveling a continuous sheet as a substrate; and continuously conducting a film deposition on the surfaces of the continuous sheet; the film deposition being conducted substantially horizontally on the surfaces of the substantially vertically traveling continuous sheet by film depositors facing each other across the continuous sheet, and the continuous sheet being a non-woven fabric having a mass of about 5 to 300 g/m$^2$, wherein the surfaces of the continuous sheet are cleaned by discharge between pretreatment electrodes prior to the film deposition.

5. A process for film deposition in which a film is deposited on surfaces of a substrate in a vacuum chamber capable of maintaining a vacuum therein, which comprises substantially vertically traveling a continuous sheet as a substrate; and continuously conducting a film deposition on the surfaces of the continuous sheet; the film deposition being conducted substantially horizontally on the surfaces of the substantially vertically traveling continuous sheet by film depositors facing each other across the continuous sheet, and the continuous sheet being a non-woven fabric having a mass of about 5 to 300 g/m$^2$, wherein the continuous sheet is used in a lightweight rubber reinforcement sheet.

6. The process according to claim 5, wherein the lightweight rubber reinforcement sheet is used to reinforce the side portions of a radial tire.

* * * * *